(12) United States Patent
Sugawara et al.

(10) Patent No.: US 9,157,146 B2
(45) Date of Patent: Oct. 13, 2015

(54) METHOD FOR DEPOSITING SILICON CARBIDE FILM

(75) Inventors: Takuya Sugawara, Yokohama (JP); Hikaru Aoshima, Yokohama (JP); Yousong Jiang, Yokohama (JP); Ichiro Shiono, Yokohama (JP); Ekishu Nagae, Yokohama (JP)

(73) Assignee: SHINCRON CO., LTD., Kanagawa (JP)

( * ) Notice: Subject to any disclaimer, the term of this patent is extended or adjusted under 35 U.S.C. 154(b) by 0 days.

(21) Appl. No.: 13/700,695

(22) PCT Filed: Aug. 2, 2011

(86) PCT No.: PCT/JP2011/067644
§ 371 (c)(1),
(2), (4) Date: Nov. 28, 2012

(87) PCT Pub. No.: WO2013/018192
PCT Pub. Date: Feb. 7, 2013

(65) Prior Publication Data
US 2014/0205844 A1    Jul. 24, 2014

(51) Int. Cl.
*C23C 14/34*    (2006.01)
*C23C 14/35*    (2006.01)
(Continued)

(52) U.S. Cl.
CPC ............. *C23C 14/35* (2013.01); *C23C 14/0078* (2013.01); *C23C 14/0635* (2013.01); *C23C 14/3464* (2013.01); *C23C 14/5826* (2013.01); *G02B 1/10* (2013.01)

(58) Field of Classification Search
CPC   C23C 14/0078; C23C 14/0635; C23C 14/35; C23C 14/5826; C23C 14/3464; G02B 1/10

USPC ............. 204/192.12, 192.15, 192.16, 192.23, 204/298.26
See application file for complete search history.

(56) References Cited

U.S. PATENT DOCUMENTS 4,720,443 A * 1/1988 Saitoh et al. ................. 430/57.6
4,834,856 A * 5/1989 Wehner .................... 204/192.24
(Continued)

FOREIGN PATENT DOCUMENTS

JP    3-271197 A    12/1991
JP    6-239609 A    8/1994
(Continued)

OTHER PUBLICATIONS

Bourenane et. al. IEEEE INternational Conference, 2008, 128-131.*
(Continued)

*Primary Examiner* — Rodney McDonald
(74) *Attorney, Agent, or Firm* — Kenealy Vaidya LLP

(57) ABSTRACT

A film deposition method of a silicon carbide thin film having a high transmissivity and high film strength applicable for optical use purposes is provided. The film can be formed safely and efficiently in a short time and on a low heat resistance substrate. The method can include depositing a silicon carbide thin film on a moving substrate by using a film formation apparatus configured such that a reaction process region and film formation process regions are arranged spatially separated from one another in a vacuum container. Silicon targets can be sputtered in one region and carbon targets can be sputtered in another region. Thereby, an interlayer thin film containing silicon and carbon is formed on the substrate. Next, in another region, the interlayer thin film can be exposed to plasma generated in an atmosphere of a mixed gas including inert gas and hydrogen.

16 Claims, 3 Drawing Sheets

(51) Int. Cl.
*C23C 14/00* (2006.01)
*C23C 14/06* (2006.01)
*C23C 14/58* (2006.01)
*G02B 1/10* (2015.01)

(56) References Cited

U.S. PATENT DOCUMENTS

| | | | |
|---|---|---|---|
| 5,248,348 A * | 9/1993 | Miyachi et al. | 136/258 |
| 5,320,984 A | 6/1994 | Zhang et al. | |
| 5,419,783 A * | 5/1995 | Noguchi et al. | 438/93 |
| 5,569,362 A * | 10/1996 | Lerbet et al. | 204/192.16 |
| 5,604,151 A | 2/1997 | Goela et al. | |
| 6,103,320 A | 8/2000 | Matsumoto et al. | |
| 6,746,776 B1 | 6/2004 | Kumagai et al. | |
| 2006/0189046 A1 | 8/2006 | Song et al. | |

FOREIGN PATENT DOCUMENTS

| | | |
|---|---|---|
| JP | 11-279758 A | 10/1999 |
| JP | 2000-239827 A | 9/2000 |
| JP | 3386436 B2 | 3/2003 |
| JP | 2005-60765 A | 3/2005 |
| JP | 2010-95431 A | 4/2010 |
| WO | 2004/108981 A1 | 12/2004 |

OTHER PUBLICATIONS

Wan et al. "Residual stress study of silicon quantum dot in silicon carbide matrix by Raman measurement", Phys. Status Solidi C 8, No. 1, 185-188 (2011—Published online Oct. 20, 2010).*

S. Inoue et al.; "Stress control of a-SiC films deposited by dual source dc magnetron sputtering"; Vacuum, 2006, vol. 80, p. 744-747.

M. Yoshino et al.; "Deposition of SiC films by ion-enhanced plasma chemical vapor deposition using tetramethylsilane +H2"; Thin Solid Films, vol. 492, 2005, p. 207-211.

J.S. Goela et al.; "Transparent chemical vapor deposities beta-SiC"; Applies Physics Letters, 1994, vol. 64, No. 2, p. 131-133.

International Search Report for PCT/JP2011/067644 dated Oct. 25, 2011.

* cited by examiner

METHOD FOR DEPOSITING SILICON CARBIDE FILM

This application is a U.S. national phase filing under 35 U.S.C. §371 of PCT Application No. PCT/JP2011/67644, filed Aug. 2, 2011, the entire disclosure of which being incorporated herein by reference.

TECHNICAL FIELD

The present invention relates to a method of forming a transparent hard thin film having a SiC composition on a substrate by using a radical assisted sputtering method.

BACKGROUND ART

A method of forming a silicon type thin film ($SiO_2$, SiC and $Si_3N_4$, etc.) on a substrate by using a so-called reactive sputtering method of introducing a reaction gas ($O_2$, $N_2$ and $CH_4$, etc.) together with an inert gas (Ar) during sputtering a Si target is known (Background art in Patent Document 1). Also known is a method of forming a SiC single-crystal thin film on a substrate by using $SiH_4$ as a Si material gas and by using a CVD (chemical vapor deposition) apparatus configured to instantaneously switch a hydrocarbon gaseous species to be supplied in a step of a preprocessing of a substrate (heating process and high temperature process) and in a step of growing a thin film on the substrate or furthermore in a temperature lowering step, so that an optimal kind of hydrocarbon gas can be supplied in each step during performing one process for forming a SiC thin film (Patent Document 2). Also, a method of manufacturing a semiconductor film by sputtering a silicon target and a carbon target in a mixed atmosphere of an inert gas and hydrogen, forming a $Si_xC_{1-x}$ film (note that 0<x<1) on a substrate and performing thermal annealing after the film formation has been known (Patent Document 3).

RELATED ART DOCUMENTS

Patent Document

Patent Document 1: Japanese Unexamined Patent Publication (Kokai) No. H03-271197
Patent Document 2: Japanese Unexamined Patent Publication (Kokai) No. 2010-95431
Patent Document 3: Gazette of Japanese Patent No. 3386436

SUMMARY OF THE DISCLOSED SUBJECT MATTER

However, since sputtering efficiency is extremely poor in the reactive sputtering method according to the background art in the patent document 1, there have been disadvantages, such that time for generating a thin film takes long and the production cost becomes high. In the CVD method according to the patent document 2, there is a disadvantage that $SiH_4$ used as a Si material is self ignitable, so that it is extremely dangerous in terms of the production procedure. Also, in a CVD method, the process has to be performed after setting a substrate temperature high as, for example, 1400° C., which is not suitable to processing of plastic substrates or other substrates having low heat resistance. Semiconductor films obtained by the method according to the patent document 3 had poor transmissivity and could not be used for the purposes requiring transparency.

As an aspect of the present invention, there is provided a film formation method, by which a silicon carbide thin film having a high transmissivity and film strength applicable to optical use purposes can be formed safely and efficiently in a short time even on a substrate having low heat resistance.

According to the present invention, there is provided a method for depositing (or forming) a silicon carbide thin film on a moving substrate while independently controlling target sputtering and plasma exposure in a vacuum state, comprising the steps of:

after sputtering a plurality of targets made of different materials separately in an inert gas atmosphere and forming an interlayer thin film containing silicon and carbon on a substrate; and exposing the interlayer thin film (or bringing the interlayer thin film contact) with plasma generated in an atmosphere of a mixed gas of an inert gas and hydrogen to bring film conversion into an ultrathin film and, subsequently, repeating formation of another interlayer thin film on the ultrathin film and film conversion into another ultrathin film.

The invention above can be implemented by using a film formation apparatus (radical assisted sputtering apparatus) configured that a reaction process region and a plurality of film formation process regions are arranged spatially separated from one another in a single vacuum container and processing in the respective regions can be controlled independently.

Specifically, there is provided a method for depositing (or forming) a silicon carbide thin film on a moving substrate by using the above-explained film formation apparatus as an example, comprising the steps of:

after sputtering any one of the plurality of targets in the respective film formation process regions in an inert gas atmosphere to form an interlayer thin film containing silicon and carbon on a substrate; and exposing the interlayer thin film with plasma generated in an atmosphere of a mixed gas of an inert gas and hydrogen to bring film conversion into an ultrathin film and, subsequently, repeating formation of another interlayer thin film on the ultrathin film and film conversion into another ultrathin film.

According to the invention above, an interlayer thin film containing silicon and carbon formed on a substrate by sputtering in an inert gas atmosphere is subjected to film conversion to be an ultrathin film by being exposed to plasma generated in an atmosphere of a mixed gas of an inert gas and hydrogen, and by repeating the same subsequently, a silicon carbide thin film can be formed safely and efficiently in a short time even on a low heat-resistant substrate.

A silicon carbide thin film formed by the method of the present invention has high transmissivity and high film strength and is suitable to use for optical purposes. Namely, according to the method of the present invention, an optical substrate, wherein a silicon carbide thin film is provided on a substrate, transmissivity is 70% or higher at a wavelength of 650 nm to 700 nm and Vickers hardness HV on the thin film side is 1300 or higher, can be obtained.

DESCRIPTION OF NUMERICAL NOTATIONS

Figure 1:
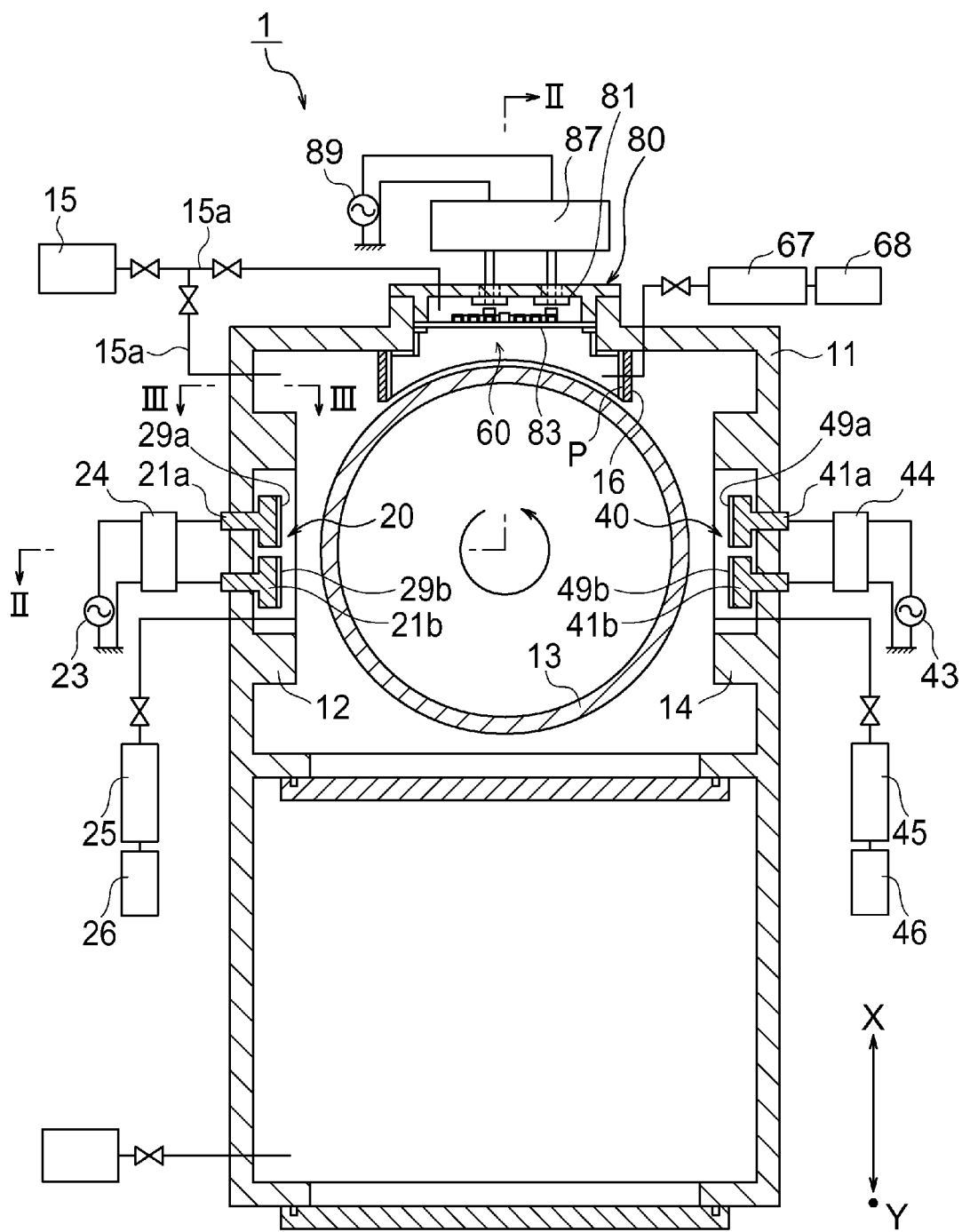
FIG. 1 is a horizontally-cut partial sectional view showing an example of a film formation apparatus for implementing the method of the present invention.

1 . . . film formation apparatus (sputtering apparatus), 11 . . . vacuum container, 13 . . . substrate holder, S . . . substrate, 12, 14 and 16 . . . partition wall 20 and 40 . . . film formation process region, sputtering source (21a, 21b, 41a and 41b . . . magnetron sputtering electrode, 23 and 43 . . . AC power source, 24 and 44 . . . transformer, 29a, 29b, 49a and 49b . . . target), sputtering gas supply means (26 and 46 . . . sputtering gas cylinder, 25 and 45 . . . mass flow controller), 60 . . . reaction process region, 80 . . . plasma source (81 . . . case body, 83 . . . dielectric plate, 85a and 85b . . . antenna, 87 . . . matching box, 89 . . . high frequency power source), reaction processing gas supply means (68 . . . reaction processing gas cylinder, 67 . . . mass flow controller)

EXEMPLARY MODE FOR CARRYING OUT THE DISCLOSED SUBJECT MATTER

Below, an embodiment of the method of the present invention will be explained in detail along with the attached drawings.

First, a configuration example of a film formation apparatus which can implement the method of the present invention will be explained.

Figure 2:
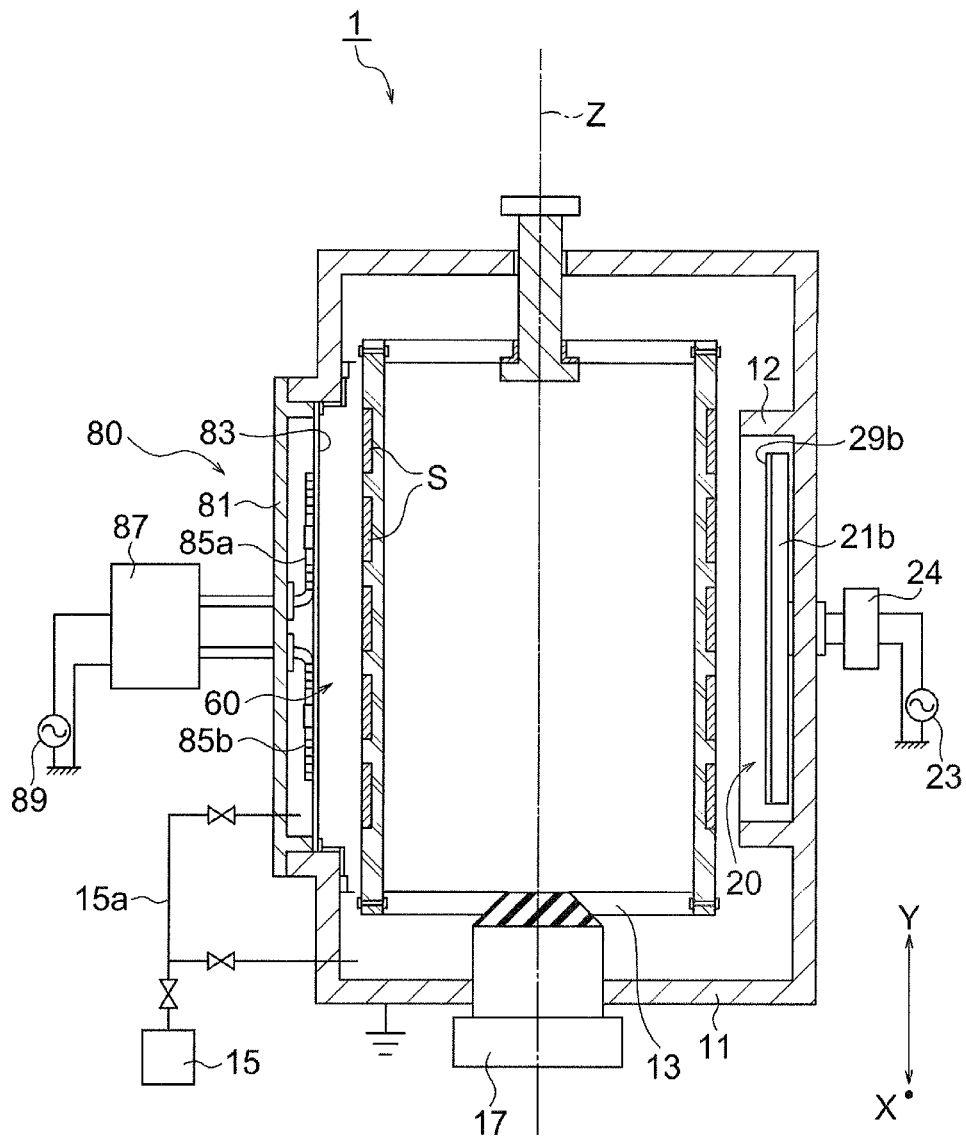
FIG. 2 is a vertically-cut partial sectional view along the line II-II in FIG. 1.

As shown in FIG. 1 and FIG. 2, a film formation apparatus 1 of the present example (hereinafter, simply referred to as abbreviated "sputtering apparatus 1") is an apparatus which can implement radical assisted sputtering (RAS) and comprises a vacuum container 11 having an approximate rectangular parallelepiped hallow shape. The vacuum container 11 is connected to a pipe 15a for exhaust, and the pipe is connected to a vacuum pump 15 for vacuuming inside the container 11. The vacuum pump 15 is configured, for example, by a rotary pump and a turbo molecular pump (TMP), etc. In side the vacuum container 11 is provided with a substrate holder 13. The substrate holder 13 is configured by a cylinder-shaped member for holding on its outer circumferential surface substrates S as film formation subjects in the vacuum container 11. The substrate holder 13 in this example is provided inside the vacuum container 11, so that the rotation axis Z extending in the cylinder direction is in the vertical direction (Y direction) of the vacuum container 11. By driving a motor 17, the substrate holder 13 rotates about the axis Z.

In the present example, there are two sputtering sources and one plasma source 80 provided around the substrate holder 13 placed inside the vacuum container 11.

In front of the respective sputtering sources, film formation process regions 20 and 40 are formed, respectively. The regions 20 and 40 are surrounded from four directions by partition walls 12 and 14 respectively protruding from an inner wall surface of the vacuum container 11 toward the substrate holder 13, so that an independent space can be secured for each of the regions inside the vacuum container 11. In the same way, a reaction process region 60 is formed in front of the plasma source 80. The region 60 is also surrounded from four directions by partition walls 16 protruding from the inner wall surface of the vacuum container 11 toward the substrate holder 13 and, thereby, a space is also secured for the region 60 independently from the regions 20 and 40 inside the vacuum container 11. In the present example, it is configured that processing in each of the regions 20, 40 and 60 can be controlled separately.

The respective sputtering sources in the present example are configured to be a dual cathode type provided with two magnetron sputtering electrodes 21a and 21b (or 41a and 41b). When forming a film (which will be explained later on), targets 29a and 29b (or 49a and 49b) are respectively held in a detachable way on surfaces of one end of the electrodes 21a and 21b (or 41a and 41b). On the other end of the electrodes 21a and 21b (or 41a and 41b), an AC power source 23 (or 43) as a power supply means is connected via a transformer 24 (or 44) as a power control means for adjusting the electric energy, so that it is configured to apply an alternating voltage of, for example, 1 k to 100 kHz or so to the respective electrodes 21a and 21b (or 41a and 41b).

Each of the sputtering sources is connected to a sputtering gas supply means. The sputtering gas supply means of the present example comprises a gas cylinder 26 (or 46) for storing a sputtering gas and a mass flow controller 25 (or 45) for adjusting a flow amount of the sputtering gas supplied from the cylinder 26 (or 46). The sputtering gas is introduced to the region 20 (or 40) through a pipe. The mass flow controller 25 (or 45) is a device for adjusting a flow amount of the sputtering gas. A flow amount from the cylinder 26 (or 46) is adjusted by the mass flow controller 25 (or 45) before the sputtering gas is introduced to the region 20 (or 40).

The plasma source 80 of the present example comprises a case body 81 fixed to cover an opening formed on the wall surface of the vacuum container 11 and a dielectric plate 83 fixed to the case body 81. It is configured that, as a result that the dielectric plate 83 is fixed to the case body 81, an antenna housing chamber is formed in a region surrounded by the case body 81 and the dielectric plate 83. The antenna housing chamber is connected with the vacuum pump 15 through a pipe 15a and the antenna housing chamber can be in a vacuum state by exhausting by vacuuming using the vacuum pump 15.

The plasma source 80 comprises antennas 85a and 85b in addition to the case body 81 and the dielectric plate 83. The antennas 85a and 85b are connected to a high frequency power source 89 via a matching box 87 for housing a matching circuit. The antennas 85a and 85b are supplied with power from the high frequency power source 89 and generate an induction field inside the vacuum container 11 (region 60), so that plasma is generated in the region 60. In the present example, it is configured that an alternating voltage having a frequency of 1 to 27 MHz is applied from the high frequency power source 89 to the antennas 85a and 85b so as to generate plasma of a reaction processing gas in the region 60. A variable capacitor is provided in the matching box 87, so that the power supplied from the high frequency power source 89 to the antennas 85a and 85b can be changed.

The plasma source 80 is connected to a reaction processing gas supply means. The reaction processing gas supply means in the present example comprises a gas cylinder 68 for storing a reaction processing gas and a mass flow controller 67 for adjusting a flow amount of the reaction processing gas to be supplied from the cylinder 68. The reaction processing gas is introduced to the region 60 through a pipe. The mass flow controller 67 is a device for adjusting a flow amount of the reaction processing gas. A flow amount from the cylinder 68 is adjusted by the mass flow controller 67 before the reaction processing gas is introduced to the region 60.

Note that the reaction processing gas supply means is not limited to the configuration above (namely, the configuration comprising one cylinder and one mass flow controller) and may be configured to comprise a plurality of cylinders and mass flow controllers (for example, as in a later explained present example, the configuration comprising two gas cylinders storing an inert gas and hydrogen separately and two mass flow controllers for adjusting flow amounts of gases supplied from the respective cylinders).

Next, an example of the method of the present invention using the sputtering apparatus 1 will be explained (refer to the flowchart in FIG. 3).

(1) First, preliminary preparation of film formation is made. Specifically, targets 29a and 29b (or 49a and 49b) are set on electrodes 21a and 21b (or 41a and 41b). Along therewith, substrates S as film forming subjects are set on the substrate holder 13 outside of the vacuum container 11 and housed in a load lock chamber in the vacuum container 11.

As the substrate S, in addition to a plastic substrate (organic glass substrate) and inorganic substrate (inorganic glass substrate), stainless steel and other metal substrate can be applied and a thickness thereof is, for example, 0.1 to 5 mm. As an inorganic glass substrate, which is an example of the substrate S, for example, soda-lime glass (6H to 7H), borosilicate glass (6H to 7H), etc. may be mentioned. Note that the number in brackets of the inorganic glass substrates is a value of pencil hardness measured by a method based on JIS-K5600-5-4.

On the outer circumferential surface of the substrate holder 13, a plurality of substrates S are arranged discontinuously along the rotation direction (crossing direction) of the substrate holder 13, and a plurality of substrates S are arranged discontinuously along the parallel direction (vertical direction, Y direction) with the axis Z of the substrate holder 13.

The targets 29a and 29b (or 49a and 49b) are obtained by forming a film material into a plate shape and held respectively on the surfaces of the electrodes 21a and 21b (or 41a and 41b), so that their longitudinal direction becomes parallel with the rotation axis Z of the substrate holder 13 and their surfaces in the parallel direction face the side surface of the substrate holder 13. In the present example, those composed of silicon (Si) are used as the targets 29a and 29b and those composed of carbon (C) are used as the targets 49a and 49b.

As the target 49a and 49b, instead of those composed of carbon (C), those composed of silicon carbide (SiC) which is a compound of a plurality of elements may be used in some cases. Also, as the targets 29a and 29b, instead of those composed of silicon (Si), those composed of silicon carbide (SiC) may be used in the same way in some cases.

As a silicon carbide target, those obtained, for example, by the method explained below may be used. First, a silicon carbide powder is added with a dispersant, a binder (for example, an organic binder) and water, agitated to fabricate a SiC slurry and molded (for example, by casting molding, press molding and extrusion molding, etc.) into a mold. Next, the obtained mold is fired, for example, at 1450 to 2300° C. or so (preferably 1500 to 2200° C. and more preferably 1600 to 1800° C.) in vacuum or in a non-oxidizing atmosphere to be sintered. Then, the obtained sintered body is impregnated with melt Si in vacuum or in a reduced non-oxidizing atmosphere at 1450 to 2200° C. or so (preferably 1500 to 2200° C. and more preferably 1500 to 1800° C.) to fill pores in the sintered body with Si. In the present example, a SiC target having a density of 3 g/cm$^3$ or higher obtained thereby may be used. With a uniform and high-density SiC target as such, stable high-input discharge can be performed when forming a film by sputtering, which can contribute to an improvement of the film forming rate.

Next, after moving the substrate holder 13 to the film forming chamber of the vacuum container 11, the vacuum container 11 is tightly closed in a state where a door to the load lock chamber is closed, and inside the vacuum container 11 is brought to be in a high vacuum state of 10$^{-5}$ to 0.1 Pa or so by using the vacuum pump 15. Meanwhile, a valve is open and the antenna housing chamber of the plasma source 80 is exhausted at the same time.

Next, the motor 17 starts to drive and rotates the substrate holder 13 about the axis Z. Consequently, the substrates S held on the outer circumferential surface of the substrate holder 13 revolve about the axis Z as a rotational axis of the substrate holder 13 and move repeatedly among positions of facing to the regions 20 and 40 and a position of facing to the region 60. In the present example, sufficient rotation rate of the substrate holder 13 is 10 rpm or higher, but it is preferably 50 rpm or higher and more preferably 80 rpm or higher. When it is 50 rpm or higher, the effect of introducing hydrogen during the plasma exposure can be suitably brought out, which easily promote improving the transmissivity and film strength of silicon carbide thin films to be formed on the substrates S. In the present example, the upper limit of the rotation rate of the substrate holder 13 is, for example, 150 rpm or so and preferably 100 rpm.

The above explanation is on the preliminary preparation of film formation in the step (hereinafter, referred to as abbreviated "S") 1 in FIG. 3.

Then, the sputtering processing performed at the regions 20 and 40 and the plasma exposure processing performed at the region 60 are repeated successively so as to generate a thin film made of silicon carbide as a final thin film having a predetermined film thickness on the substrate S.

In the present example, an interlayer thin film is formed on the substrate S surface by the both successive sputtering processing, then, the interlayer thin film becomes an ultrathin film by film conversion in the subsequent plasma exposure processing. As a result that the both sputtering processing and the plasma exposure processing are performed repeatedly, next ultrathin film is deposited on the ultrathin film. This operation is repeated until a final thin film is obtained.

Note that, in the present example, "interlayer thin film" is a thin film formed by passing through both of the region 20 and the region 40. The term "ultrathin film" is used for preventing it from being confused with a finally obtained "thin film", because a plurality of the ultrathin films are deposited to form the final thin film (a thin film having an intended film thickness), and it is also used in a meaning that it is well thinner than the final "thin film".

Figure 3:
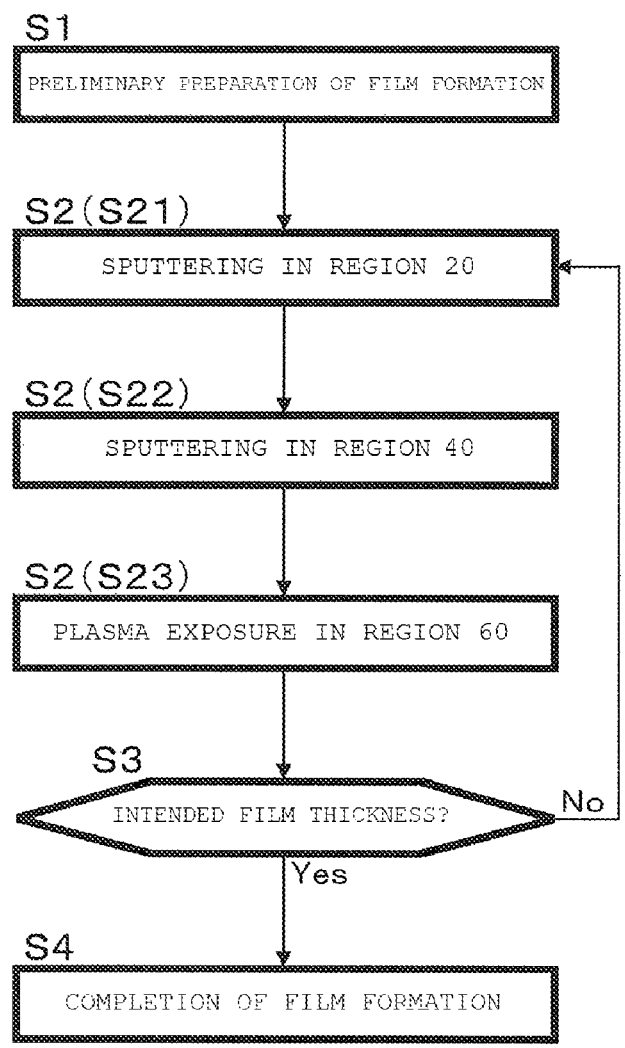
FIG. 3 is a flowchart showing a film formation method using the film formation apparatus in FIG. 1 and FIG. 2.

(2) Next, film formation starts in S2 in FIG. 3. Sputtering processing in the present example is performed as below.

First, after confirming pressure stability inside the vacuum container 11, a pressure in the region 20 is adjusted, for example, to 0.05 to 0.2 Pa, then, a predetermined flow amount of sputtering gas is introduced to the region 20 from the gas cylinder 26 via the mass flow controller 25.

In the present example, an inert gas is used alone as the sputtering gas, and a reactive gas, such as nitrogen and oxygen, is not used together. Therefore, the film forming rate does not decline comparing with that in the case of a reactive sputtering method wherein a reaction gas as such is introduced together. An introducing flow amount of an inert gas is, for example, 100 to 600 sccm and preferably 150 to 500 sccm or so in the present example. Thereby, vicinity of the targets 29a and 29b becomes an inert gas atmosphere. In this state, an alternating voltage is applied from the AC power source to the electrodes 21a and 21b via a transformer 22 so as to cover the targets 29a and 29b with an alternating electric field.

In the present example, electric power (sputtering power) is supplied, so that the sputtering power density to the targets 29a and 29b becomes 1.5 W/cm$^2$ to 2.0 W/cm$^2$, preferably 1.6 W/cm$^2$ to 1.8 W/cm$^2$, and particularly preferably around 1.7 W/cm$^2$. The "power density" means electric power (W) supplied to the targets 29a and 29b (or 49a and 49b) per unit area (cm$^2$) (It will be the same below).

By supplying power to the targets 29a and 29b, the target 29a becomes cathode (negative electrode) at one point and the target 29b inevitably becomes anode (positive electrode) at the same time. At the next moment, when the direction of the alternating power changes, the target 29b in turn becomes cathode (negative electrode) and the target 29a becomes anode (positive electrode). As a result that the targets 29a and 29b in a pair alternately become anode and cathode, a part of the sputtering gas (inert gas) around the targets 29a and 29b emits electrons and becomes ionized. A leakage magnetic field is formed on the surfaces of the targets 29a and 29b by magnets arranged at the electrodes 21a and 21b, therefore, the electrons go around drawing a toroidal curve in the magnetic field generated near the surfaces of the targets 29a and 29b. Strong plasma is generated along the orbit of the electrons, ions of the sputtering gas in the plasma are accelerated toward a target in a negative potential state (cathode side) to collide with the respective targets 29a and 29b, so that atoms and particles (Si atoms and Si particles) on the surfaces of the targets 29a and 29b are beaten out (sputtered). These atoms and particles are film raw materials, materials for a thin film, which adhere to the surface of the substrate S.

Sputtering of a silicon target (or carbon target) in the region 20 in S21 in FIG. 3 is as explained above.

During performing the sputtering, non-conductive or low-conductive incomplete reactants, etc. may adhere to an anode, however, they are sputtered when the anode is converted to a cathode due to the alternating field and the target surfaces are restored to be in the initial clean state. Also, as a result that the pair of targets 29a and 29b repeat alternately becoming an anode and a cathode, an always stable anode potential state can be obtained, fluctuation of a plasma potential (normally almost equal to an anode potential) is prevented, and the film raw materials adhere stably to the surface of the substrate S.

In the present example, the region 40 is also activated together with activation of the region 20 (supply of a sputtering gas and supply of power from the AC power source 23). Specifically, a pressure in the region 40 is adjusted, for example, to 0.05 to 0.2 Pa, then, a sputtering gas in a predetermined flow amount is introduced to the region 40 from the gas cylinder 46 via the mass flow controller 45.

In the present example, an inter gas is used alone as a sputtering gas in the same way as above, and an introducing flow amount of the inter gas is, for example, 100 to 600 sccm and preferably 150 to 500 sccm or so. Thereby, vicinity of the targets 49a and 49b also becomes an inert gas atmosphere. In this state, an alternating voltage is applied from the AC power source 43 to the electrodes 41a and 41b via the transformer 42 so as to cover the targets 49a and 49b with an alternating electric field.

In the present example, it is significant to supply power to the targets 49a and 49b, so that a sputtering power density becomes predetermined times (for example, 4.5 to 5.5 times, preferably 4.8 to 5.2 times and particularly preferably around 5 times) a power density for sputtering the targets 29a and 29b. Thereby, it becomes possible to efficiently form a silicon carbide thin film having high transmissivity and film strength, which is advantageous. The power density to the targets 49a and 49b is, for example, 8.5 W/cm$^2$ to 9.0 W/cm$^2$, preferably 8.5 W/cm$^2$ to 8.7 W/cm$^2$ and particularly preferably around 8.6 W/cm$^2$ when the power density to the targets 29a and 29b above is 1.5 W/cm$^2$ to 2.0 W/cm$^2$.

Note that when using those composed of silicon (Si) as the targets 29a and 29b and those composed of silicon carbide (SiC) as the targets 49a and 49b, the targets 49a and 49b may be supplied with power, with which a sputtering power density becomes predetermined times (for example, 2 to 3 times, preferably 2.3 to 2.8 times and particularly preferably around 2.5 times) a power density for sputtering the targets 29a and 29b. In that case, when the power density to the targets 29a and 29b above is 3.0 to 4.0 W/cm$^2$ (preferably 3.3 to 3.7 W/cm$^2$ and particularly preferably around 3.5 W/cm$^2$), a power density to the targets 49a and 49b may be, for example, 7.5 to 10 W/cm$^2$, preferably 8.2 to 9.3 W/cm$^2$ and particularly preferably around 8.8 W/cm$^2$.

On the other hand, when using those composed of silicon carbide (SiC) as the targets 29a and 29b and those composed of carbon (C) as the targets 49a and 49b, the targets 29a and 29b can be supplied with power, with which the sputtering power density becomes predetermined times (for example, 0.5 to 1.2 times, preferably 0.7 to 1.0 time, particularly preferably around 0.8 time) a power density for sputtering 49a and 49b. In that case, the power density to the targets 29a and 29b may be, for example, 7 to 15 W/cm$^2$, preferably 9 to 13 W/cm$^2$, and more preferably around 11 W/cm$^2$ when a power density to the targets 49a and 49b is 10 to 18 W/cm$^2$ (preferably 13 to 15 W/cm$^2$ and particularly preferably around 14 W/cm$^2$).

In the same way as explained above, by supplying power to the targets 49a and 49b, the target 49a becomes cathode at one point and the target 49b inevitably becomes anode at the same time. When the direction of the alternating power changes at the next moment, the target 49b becomes cathode and the target 49a becomes anode. As a result that the targets 49a and 49b in a pair alternately become anode and cathode, a part of the sputtering gas (inert gas) around the targets 49a and 49b emits electrons and becomes ionized. Since a leakage magnetic field is formed on the surface of the targets 49a and 49b by magnets arranged at the electrodes 41a and 41b, the electrons go around drawing a toroidal curve in the magnetic field generated near the surface of the targets 49a and 49b. Strong plasma is generated along the orbit of the electrons, ions of the sputtering gas in the plasma are accelerated toward a target in a negative potential state (cathode side) to collide with the respective targets 49a and 49b, so that atoms and particles (C atoms and C particles, etc.) on the surfaces of the targets 49a and 49b are beaten out. These atoms and particles are film raw materials, materials for a thin film, which adhere to Si atoms and Si particles already adhered to the substrate S in this example so as to form an interlayer thin film.

Sputtering of a carbon target (or silicon carbide target) in the region 40 in S22 in FIG. 3 is as explained above.

Note that the interlayer thin film here is composed of a mixture of elements (Si atoms or Si particles and C atoms or C particles) and assumed not in a firm chemical binding state.

Plasma processing is performed as below. In the present example, the region 60 is also activated together with activation of the regions 20 and 40. Specifically, a reaction processing gas in a predetermined flow amount is introduced from the gas cylinder 68 to the region 60 via the mass flow controller 67 so as to bring the vicinity of the antennas 85a and 85b a predetermined gas atmosphere.

A pressure in the region 60 is maintained, for example, to 0.07 to 1 Pa. Also, at least during plasma is generated in the region 60, the pressure inside the antenna housing chamber is maintained to 0.001 Pa or lower. In a state where the reaction processing gas is introduced from the cylinder 68, when a voltage having a frequency of 100 k to 50 MHz (preferably 1M to 27 MHz) is applied to the antennas 85a and 85b from the high frequency power source 89, plasma is generated in a region facing to the antennas 85a and 85b in the region 60. Power (plasma processing power) supplied from the high frequency power source 89 may be as large as, for example, 3 kW or more, preferably 4 kW or more and more preferably 4.5 kW or more when the substrate S is configured by a glass material, while when the substrate S is configured by a resin material, it may be as small as, for example, 1 kW or less, preferably 0.8 kW or less and more preferably 0.5 kW or less.

In the present example, it is significant to use a mixed gas of an inert gas and hydrogen as the reaction processing gas. Consequently, ions ($H_2^+$) of hydrogen molecules ($H_2$) and/or active species of hydrogen are present in the plasma generated in the present example, and they are introduced to the region 60. When the substrate holder 13 rotates to feed the substrates S to the region 60, an interlayer thin film composed of a mixture of Si and C formed on the surface of each substrate S in the regions 20 and 40 is subjected to plasma exposure processing and turned into a compound of Si and C in a chemically firm binding state by film conversion so as to form an ultrathin film.

Plasma exposure of the interlayer thin film in the region 60 in S23 in FIG. 3 is as explained above.

In the present example, the respective steps in S21 to S23 in FIG. 3 (that is, both sputtering processing and plasma exposure processing) are repeated (in the case of "No" in S3: thin film deposition step) until the ultra thin film to be formed on the surface of the substrates S reaches a predetermined film thickness (for example, about 3 μm or thicker, preferably about 3 to 7 μm). As a result, the final thin film (SiC thin film) having an intended film thickness is generated on the substrates S.

The present inventors found the fact through experiments that, by bringing plasma generated in an atmosphere of a mixed gas of an inert gas and hydrogen contact with the interlayer thin film to convert it into an ultrathin film and, then, stacking the ultrathin films until reaching to a predetermined film thickness, a silicon carbide thin film having high transmissivity and film strength can be formed on a substrate S. It is not all clear the reason why a silicon carbide thin film having excellent film properties can be obtained by performing the processing as above. In the present example, the configuration is largely different from that of normal continuous film forming (a vacuum deposition method, etc.) on the point that deposition of an interlayer thin film and exposure to plasma are independent in terms of time and the two are cyclically repeated. Furthermore, in the present example, the deposited interlayer thin film is exposed to specific plasma generated in an atmosphere of a mixed gas obtained by including hydrogen in an inert gas. It is presumed that, by bringing the specific plasma contact with an interlayer thin film, the interlayer thin film efficiently takes in energy from ions ($H_2^+$) of hydrogen molecules and active species in plasma during film conversion of the interlayer thin film into an ultrathin film, consequently, highly strong binding is attained between atoms, and transmissivity and film strength of a silicon carbide thin film as the final thin film are improved. The present inventors consider that ions ($H_2^+$) of hydrogen molecules in plasma in particular have a stimulating effect in binding atoms in the interlayer thin film.

In the present example, a mixing ratio of an inert gas and hydrogen in a volume conversion is preferably 97:3 to 80:20 (namely, a hydrogen concentration of 3 to 20%), more preferably 97:3 to 90:10 (hydrogen concentration of 3 to 10%), furthermore preferably 97:3 to 94:6 (hydrogen concentration of 3 to 6%) and particularly preferably around 95:5 (hydrogen concentration of around 5%). There is a tendency that transmissivity of a silicon carbide thin film becomes higher as the hydrogen concentration becomes higher, however, when the concentration is too high (for example, exceeding 20%), it may raise concerns over safety control in the manufacture procedure and it is liable that balance becomes poor between transmissivity and film strength of a silicon carbide thin film to be formed. On the other hand, when the hydrogen concentration is too low, transmissivity of an obtained silicon carbide thin film declines.

In the present example, a flow amount of introducing the mixed gas is, for example, 300 to 1000 sccm and preferably 400 to 600 sccm or so. When the introducing flow amount of the mixed gas is small, it is liable that both of transmissivity and film strength decline in a silicon carbide thin film to be formed. On the contrary, when the introducing flow amount is too large, a security hazard may arise.

In both of the sputtering processing and the plasma exposure processing explained above, for example, argon and helium, etc. may be mentioned as an inert gas in general. In the present example, the case of using argon as an inert gas will be explained as an example.

(3) If "Yes" in S3 in FIG. 3, the step explained above finishes (S4). Specifically, re-rotation of the substrate holder 13 stops, the vacuum state inside the vacuum container 11 is deactivated, the substrate holder 13 is taken out from the vacuum container 11, and substrates S after being processed are collected from the substrate holder 13.

The silicon carbide thin film formed on the substrate S in the present example has high transmissivity and film strength. Specifically, in a state where the silicon carbide thin film is provided on the substrate S, the transmissivity at a wavelength of 650 nm to 700 nm is 70% or higher and preferably 75% or higher, Vickers hardness HV on the thin film side is 1300 or higher, preferably 1500 or higher, more preferably 1700 or higher and furthermore preferably 1800 or higher. Moreover, a coefficient of dynamic friction μk can be suppressed to 0.5 or smaller. An optical substrate, wherein the silicon carbide thin film as above is formed on the substrate S, can be used, for example, as a window material of a sandblast apparatus, etc.

Vickers hardness HV is one kind of indentation hardness and used generally as one of values indicating hardness of an object. The measurement method is to use as an indenter a diamond equilateral pyramid having a facing angle of 136° against a surface of a material and measure a diagonal length of a square indent caused by pressing a sample with the indenter with a certain weight load. A surface area of the indent is obtained from the diagonal length, and a value obtained by dividing the weight load by the surface area is the Vickers hardness. The Vickers hardness is indicated only by a numerical number with no unit.

(4) The example explained above is described to facilitate understanding of the present invention and is not to limit the present invention. Accordingly, respective elements disclosed in the above example include all design modifications and equivalents belonging to the technical scope of the present invention.

In the embodiment above, a plasma aftertreatment may be furthermore performed after generating a final thin film (silicon carbide thin film) having an intended film thickness on a substrate S. Specifically, rotation of the substrate holder 13 is suspended first and operations at the regions 20 and 40 (supply of a sputtering gas and power supply from the AC power sources 23 and 43) are stopped. On the other hand, operation at the region 60 is kept continuing as it is. Namely, in the region 60, plasma is generated continuously by continuing the supply of the reactive processing gas and supply of power from the high frequency power source 89. In this state, the substrate holder 13 is rotated again to feed substrates S to the region 60, then, the silicon carbide thin films generated on the substrates S are subjected to plasma processing while passing through the region 60 (aftertreatment). By performing the plasma aftertreatment, transmissivity of the final thin film is expected to be improved.

In the present example, when performing the plasma aftertreatment, the plasma exposure processing at the time of forming a silicon carbide thin film and the plasma aftertreatment after forming the silicon carbide thin film may be performed under the same condition or different conditions.

When performing the plasma aftertreatment, for example, a hydrogen gas concentration in the mixed gas may be changed. For example, when the mixture ratio of the inert gas and hydrogen is 95:5 in plasma exposure processing in forming a silicon carbide thin film, that in the plasma aftertreatment may be 93:7 so that a hydrogen concentration becomes higher in the latter than that in the former, or the processing may be performed in the opposite way. When the hydrogen concentration in the latter is higher than that in the former, permittivity is expected to be furthermore improved.

When performing the plasma aftertreatment, plasma processing power (power supplied from the high frequency power source 89) may be changed from that in the plasma exposure processing for forming a silicon carbide film. In that case, it can be adjusted by the matching box 87. Suitable time for the plasma aftertreatment is selected from a range of, for example, 1 to 60 minutes or so.

In the embodiment above, an explanation was made on an example case of forming a silicon carbide thin film by using a sputtering apparatus 1 capable of implementing a radical assisted sputtering method, wherein magnetron sputtering as an example of sputtering is performed. However, it is not limited to that and film may be formed by other sputtering method using a film formation apparatus for implementing other well-known sputtering, such as double-pole sputtering not using magnetron discharge. Note that the atmosphere in the sputtering is an inert gas atmosphere in all cases.

EXAMPLES

Next, the invention will be explained further in detail by using more specific examples of the embodiment of the invention explained above.

Experimental Examples 1 to 5

By using the sputtering apparatus 1 shown in FIG. 1 and FIG. 2, a plurality of glass substrates BK7 were set as substrates S on the substrate holder 13, and sputtering in the region 20, sputtering in the region 40 and plasma exposure in the region 60 were repeated (thin film deposition step) so as to obtain samples of respective experimental examples, wherein a silicon carbide thin film having a thickness of 4 μm was formed on the substrate S.
  Film Forming Rate: 0.1 nm/s
  Substrate Temperature: room temperature
  <<Sputtering in Region 20>>
  Sputtering Gas: Ar
  Sputtering Gas pressure: 0.1 Pa
  Flow Amount of Introducing Sputtering Gas: 150 sccm
  Targets 29a and 29b: Silicon (Si)
  Sputtering Power Density: 1.7 W/cm$^2$
  Frequency of Alternating Voltage Applied to Electrodes 21a and 21b: 40 kHz
  <<Sputtering in Region 40>>
  Sputtering Gas: Ar
  Sputtering Gas pressure: 0.1 Pa
  Flow Amount of Introducing Sputtering Gas: 150 sccm
  Targets 49a and 49b: Carbon (C)
  Sputtering Power Density: 8.6 W/cm$^2$
  (equivalent to approximately five times a power density of sputtering targets 29a and 29b composed of silicon (Si))
  Frequency of Alternating Voltage Applied to Electrodes 41a and 41b: 40 kHz
  <<Plasma Exposure in Region 60>>
  Reaction Processing Gas: Ar+H$_2$
  Hydrogen Concentration in Reaction Processing Gas: refer to Table 1
  Reaction Processing Gas Pressure: 0.3 Pa
  Flow Amount of Introducing Reaction Processing Gas: 500 sccm
  Power Supplied from High Frequency Power Source 89 to Antennas 85a and 85b (Plasma Processing Power): 2 kW
  Frequency of Alternating Voltage Applied to Antennas 85a and 85b: 13.56 MHz
  <<Evaluation>>

Properties of the obtained samples were evaluated in the methods explained below, and the results are shown in Table 1.

(1) Evaluation of Film Strength

A microhardness tester (MMT-X7 made by Matsuzawa Co., Ltd.) was used to measure hardness on a surface of a silicon carbide thin film in the experimental example samples under the measurement condition below.
  Indenter Shape: Vickers indenter (a=136°)
  Measurement Environment: temperature 20° C., relative humidity 60%
  Test Load: 25 gf
  Loading Speed: 10μ/s
  Maximum Load Creep Time: 15 seconds (2) Evaluation of Transmissivity Transmissivity at a wavelength of 650 nm to 700 nm was measured by using a spectral photometer (product name: U-4000 made by Hitachi High-Technologies Corporation).

(3) Evaluation of Sliding Property

An automatic friction abrasion analyzer (Triboster TS501 made by Kyowa Interface Science Co., Ltd.) using a horizontal linear reciprocating motion system was used to measure a coefficient of dynamic friction (μk) on the silicon carbide thin film side of the samples under the condition of a load: 50 g, speed: 60 mm/min. and measurement reciprocating times: 10 times.

TABLE 1

| Experimental Examples | Hydrogen Concentration (%) | Vickers Hardness HV | Transmissivity | Dynamic Friction Coefficient μk |
|---|---|---|---|---|
| 1 | 0 | 1200 | 50 | 0.7 |
| 2 | 3 | 1300 | 70 | 0.7 |
| 3 | 5 | 1700 | 80 | 0.5 |
| 4 | 10 | 1900 | 84 | 0.4 |
| 5 | 20 | 1600 | 87 | 0.4 |

The following can be understood from Table 1. First, as to Vickers hardness HV on the silicon carbide thin film surfaces, as the value of a hydrogen concentration in the mixed gas becomes higher in the range of 0% to 10%, it exhibited a tendency of increasing. When the hydrogen concentration exceeds 10%, it exhibited a tendency of decreasing as the value becomes higher. Next, as to the transmissivity of the experimental example samples, it exhibited a tendency of improving as the hydrogen concentration in the mixed gas becomes higher.

Particularly, in the experimental examples 2 to 5 (hydrogen concentrations were 3 to 20%), it was confirmed that preferable results were obtained that HV was 1300 or higher and a transmissivity was 70% or higher. Among them, samples in the experimental example 3 were confirmed to have excellent balance of transmissivity and film strength. On the other hand, in the experimental example 1 (the hydrogen concentration was zero), HV was 1200, which means hardness was insufficient and the transmissivity was 50%, which was not enough.

As to the dynamic friction coefficient μk on the thin film side, the value tends to become large as the hydrogen concentration in the mixed gas becomes higher, which means it was confirmed that the sliding property was improved.

Experimental Examples 6 to 10

The targets 49a and 49b in the region 40 were changed to those composed of silicon carbide (SiC). Also, a sputtering power density for the targets 29a and 29b composed of silicon (Si) was changed to 3.5 W/cm$_2$. Furthermore, a sputtering power density for the targets 49a and 49b was changed to 8.8 W/cm$_2$ (equivalent to approximately 2.5 times the power density for sputtering the targets 29a and 29b).

Other than the above, film formation was performed under the same condition as that in the experimental examples 1 to 5 to obtain respective samples, wherein a silicon carbide thin film having a thickness of 4 μm was formed on a substrate S. When the same evaluations as those in the experimental examples 1 to 5 were made on the obtained respective samples, it was confirmed that the same tendency was exhibited.

Experimental Examples 11 to 15

A sputtering power density for the targets 49a and 49b composed of carbon (C) was changed to 14 W/cm$_2$ in the region 40. Also, the targets 29a and 29b were changed to those composed of silicon carbide (SiC). Furthermore, a sputtering power density for the targets 29a and 29b was changed to 11 W/cm$_2$ (equivalent to approximately 0.8 time the power density for sputtering the targets 49a and 49b composed of carbon (C)).

Other than the above, film formation was performed under the same condition as that in the experimental examples 1 to 5 to obtain samples of respective experimental examples, wherein a silicon carbide thin film having a thickness of 4 μm was formed on a substrate S. When the same evaluations as those in the experimental examples 1 to 5 were made on the obtained respective samples, it was confirmed that the same tendency was exhibited.

The invention claimed is:

1. A method for depositing a silicon carbide thin film on a moving substrate while independently controlling sputtering of a plurality of targets made of different materials and plasma exposure in a vacuum state by using a film formation apparatus configured that a reaction process region and a plurality of film formation process regions are arranged spatially separated from one another in a single vacuum container and that processing in the respective regions can be controlled independently, comprising the steps of:

after sputtering the plurality of targets sequentially in the respective film formation process regions in an inert gas atmosphere to form an interlayer thin film containing silicon and carbon on a substrate;

exposing the interlayer thin film with plasma generated in an atmosphere of a mixed gas of an inert gas and hydrogen, wherein a hydrogen concentration is 3 to 20%, in the reaction process region to bring film conversion into an ultrathin film; and subsequently, repeating formation of another interlayer thin film on the ultrathin film and film conversion into another ultrathin film.

2. The film deposition method according to claim 1, wherein two targets selected from a silicon target, a carbon target and a silicon carbide target are used.

3. The film deposition method according to claim 2, wherein in the case of using a silicon target and a carbon target, the carbon target is sputtered at a power density of around 5 times a power density of sputtering the silicon target.

4. The film deposition method according to claim 3, wherein the silicon target is sputtered at a power density of around 1.7 W/cm$^2$.

5. The film deposition method according to claim 2, wherein in the case of using a silicon target and a silicon carbide target, the silicon carbide target is sputtered at a power density of around 2.5 times a power density of sputtering the silicon target.

6. The film deposition method according to claim 5, wherein the silicon target is sputtered at a power density of around 3.5 W/cm$^2$.

7. The film deposition method according to claim 2, wherein in the case of using a carbon target and a silicon carbide target, the silicon carbide target is sputtered at a power density of around 0.8 times a power density of sputtering the carbon target.

8. The film deposition method according to claim 7, wherein the carbon target is sputtered at a power density of around 14 W/cm$^2$.

9. A method for depositing a silicon carbide thin film on a moving substrate while independently controlling target sputtering and plasma exposure in a vacuum state, comprising the steps of:

after sputtering a plurality of targets made of different materials separately and sequentially in respective separate regions in an inert gas atmosphere and forming an interlayer thin film containing silicon and carbon on a substrate;

exposing the interlayer thin film with plasma generated in an atmosphere of a mixed gas of an inert gas and hydrogen, wherein a hydrogen concentration is 3 to 20%, to bring film conversion into an ultrathin film; and subsequently, repeating formation of another interlayer thin film on the ultrathin film and film conversion into another ultrathin film.

10. The film deposition method according to claim 9, wherein two targets selected from a silicon target, a carbon target and a silicon carbide target are used.

11. The film deposition method according to claim 10, wherein in the case of using a silicon target and a carbon target, the carbon target is sputtered at a power density of around 5 times a power density of sputtering the silicon target.

12. The film deposition method according to claim 11, wherein the silicon target is sputtered at a power density of around 1.7 W/cm$^2$.

13. The film deposition method according to claim 10, wherein in the case of using a silicon target and a silicon carbide target, the silicon carbide target is sputtered at a power density of around 2.5 times a power density of sputtering the silicon target.

14. The film deposition method according to claim 13, wherein the silicon target is sputtered at a power density of around 3.5 W/cm$^2$.

15. The film deposition method according to claim 10, wherein in the case of using a carbon target and a silicon carbide target, the silicon carbide target is sputtered at a power density of around 0.8 times a power density of sputtering the carbon target.

16. The film deposition method according to claim 15, wherein the carbon target is sputtered at a power density of around 14 W/cm$^2$.

* * * * *